(12) United States Patent
Chuang

(10) Patent No.: US 12,100,445 B2
(45) Date of Patent: Sep. 24, 2024

(54) INTEGRATED CIRCUIT AND METHOD

(71) Applicant: TAIWAN SEMICONDUCTOR MANUFACTURING COMPANY, LTD., Hsinchu (TW)

(72) Inventor: Mei-Chen Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/362,393

(22) Filed: Jul. 31, 2023

(65) Prior Publication Data

US 2023/0377641 A1    Nov. 23, 2023

Related U.S. Application Data

(62) Division of application No. 17/463,082, filed on Aug. 31, 2021, now Pat. No. 11,837,281.

(51) Int. Cl.
| | |
|---|---|
| *G11C 7/00* | (2006.01) |
| *G06N 3/063* | (2023.01) |
| *G11C 11/54* | (2006.01) |
| *G11C 13/00* | (2006.01) |

(52) U.S. Cl.
CPC .............. *G11C 11/54* (2013.01); *G06N 3/063* (2013.01); *G11C 13/0002* (2013.01)

(58) Field of Classification Search
CPC ... G11C 11/54; G11C 13/0002; G11C 7/1006; G11C 13/0023; G06N 3/045
See application file for complete search history.

(56) References Cited

U.S. PATENT DOCUMENTS

| | | |
|---|---|---|
| 2015/0028847 A1 | 1/2015 | Vanhoucke et al. |
| 2018/0316493 A1 | 11/2018 | Kvatinsky et al. |
| 2018/0364785 A1 | 12/2018 | Hu et al. |
| 2019/0088325 A1 | 3/2019 | Wu et al. |
| 2021/0342489 A1 | 11/2021 | Kumar et al. |
| 2021/0397968 A1* | 12/2021 | Thiele ............... G06N 3/049 |
| 2023/0097217 A1* | 3/2023 | Rasch ............... G06N 3/045 706/25 |
| 2023/0306251 A1* | 9/2023 | Ambrogio ........... G11C 13/003 |

* cited by examiner

*Primary Examiner* — Hien N Nguyen
(74) *Attorney, Agent, or Firm* — Hauptman Ham, LLP

(57) ABSTRACT

An interface circuit includes an integrator circuit and a buffer circuit. The integrator circuit is configured to be electrically coupled to a column of memory cells, receive a signal corresponding to a sum of currents flowing through the memory cells of the column, and integrate the signal over time to generate an intermediate voltage. The buffer circuit is electrically coupled to an output of the integrator circuit to receive the intermediate voltage, and is configured to be electrically coupled to a row of further memory cells, generate an analog voltage corresponding to the intermediate voltage, and output the analog voltage to the further memory cells of the row.

20 Claims, 9 Drawing Sheets

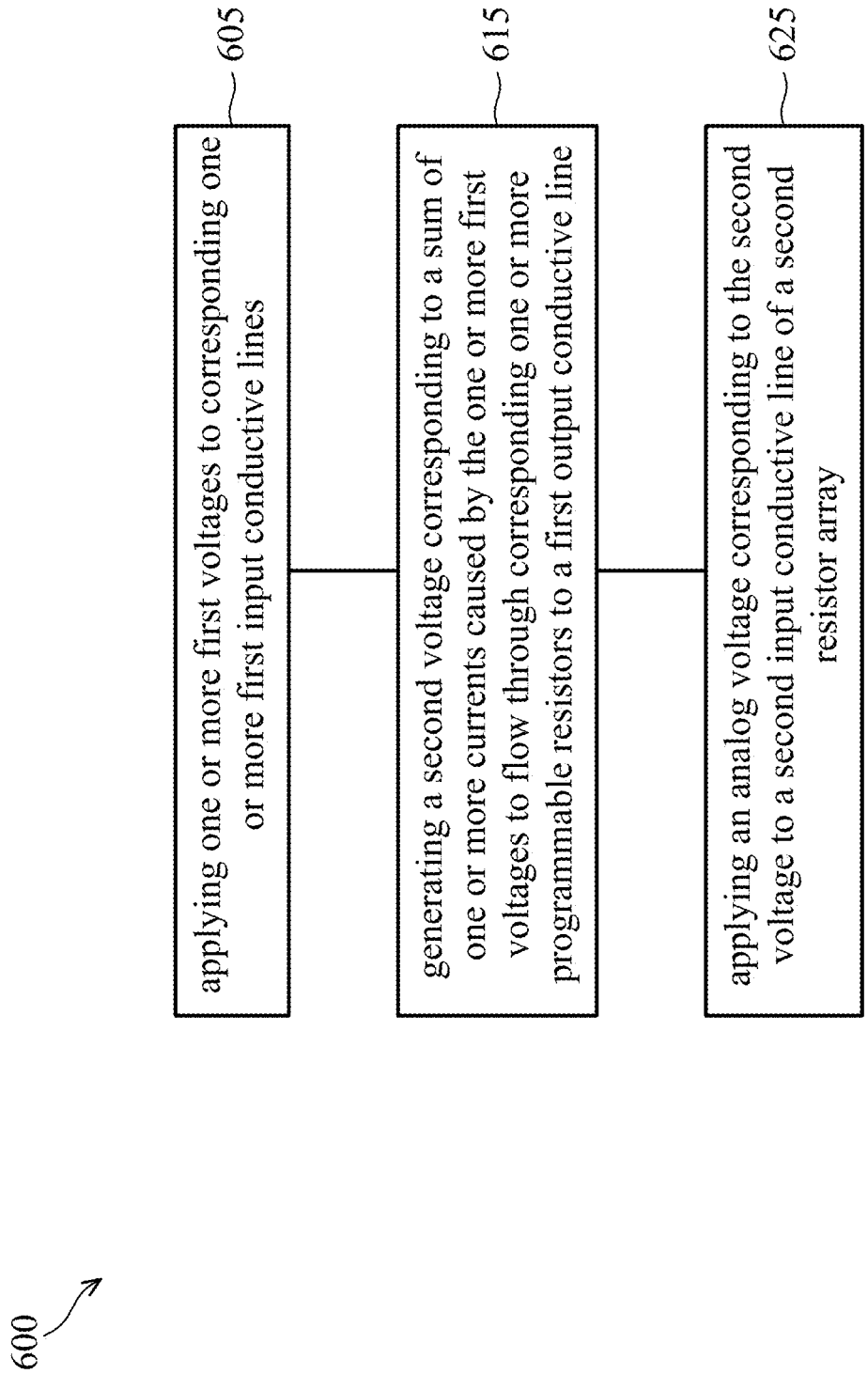

INTEGRATED CIRCUIT AND METHOD

RELATED APPLICATION(S)

This application is a divisional application of U.S. patent application Ser. No. 17/463,082, filed Aug. 31, 2021, the disclosure of which is hereby incorporated by reference in its entirety.

BACKGROUND

Recent developments in the field of artificial intelligence have resulted in various products and/or applications, including, but not limited to, speech recognition, image processing, machine learning, natural language processing, or the like. Such products and/or applications often use neural networks to process large amounts of data for learning, training, cognitive computing, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of a method in accordance with some embodiments.

DETAILED DESCRIPTION

Figure 1A:
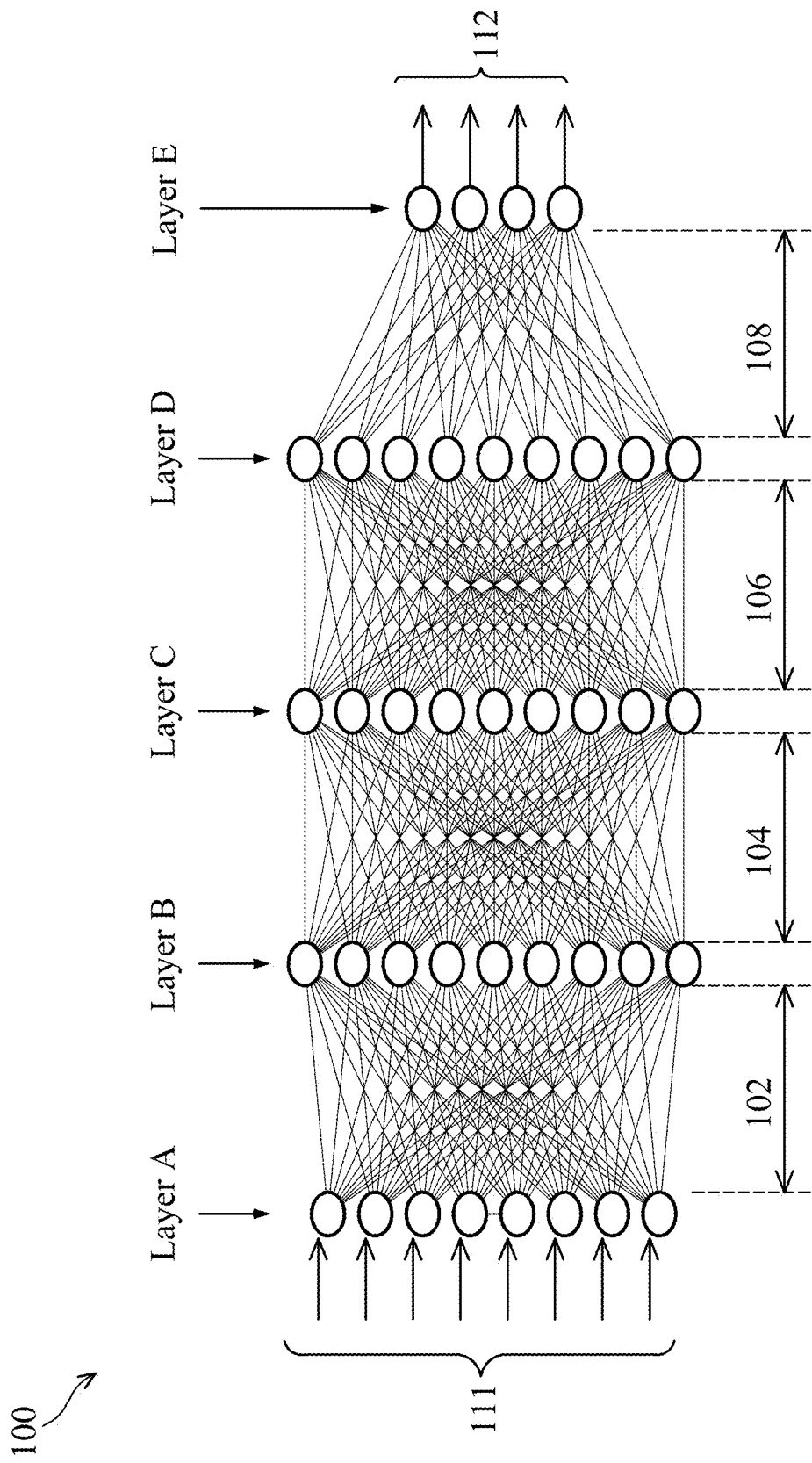
FIG. 1A is a schematic diagram of a neural network.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A neural network is implemented by several matrices or arrays of resistors arranged in successive layers through which data propagate. In some embodiments, data are transferred from one resistor array to a next resistor array by analog voltages. As a result, it is possible to omit analog-to-digital conversion or analog-to-digital converters (ADCs) between successive layers in a neural network. As ADCs often occupy a large chip area, sometimes even larger than the chip area of resistor arrays, by omitting ADCs between successive layers in a neural network, at least one embodiment makes it possible to significantly reduce the chip area as well as power consumption of an integrated circuit (IC) implementing the neural network. Reduced area and power consumption in accordance with some embodiments are improvements over other approaches where ADCs are used for data conversion and/or data transfer between successive layers of a neural network.

FIG. 1A is a schematic diagram of a neural network 100, in accordance with some embodiments.

The neural network 100 comprises a plurality of layers A-E each comprising a plurality of nodes (or neurons). The nodes in successive layers of the neural network 100 are connected with each other by a matrix or array of connections. For example, the nodes in layers A and B are connected with each other by connections in a matrix 102, the nodes in layers B and C are connected with each other by connections in a matrix 104, the nodes in layers C and D are connected with each other by connections in a matrix 106, and the nodes in layers D and E are connected with each other by connections in a matrix 108. Layer A is an input layer configured to receive input data 111. The input data 111 propagate through the neural network 100, from one layer to the next layer via the corresponding matrix of connections between the layers. As the data propagate through the neural network 100, the data undergo one or more computations as described with respect to FIG. 1B, and are output as output data 112 from layer E which is an output layer of the neural network 100. Layers B, C, D between input layer A and output layer E are sometimes referred to as hidden or intermediate layers. The number of layers, number of matrices of connections, and number of nodes in each layer in FIG. 1A are examples. Other configurations are within the scopes of various embodiments. For example, in at least one embodiment, the neural network 100 includes no hidden layer, and has an input layer connected by one matrix of connections to an output layer. In one or more embodiments, the neural network 100 has one, two, or more than three hidden layers.

Figure 1B:
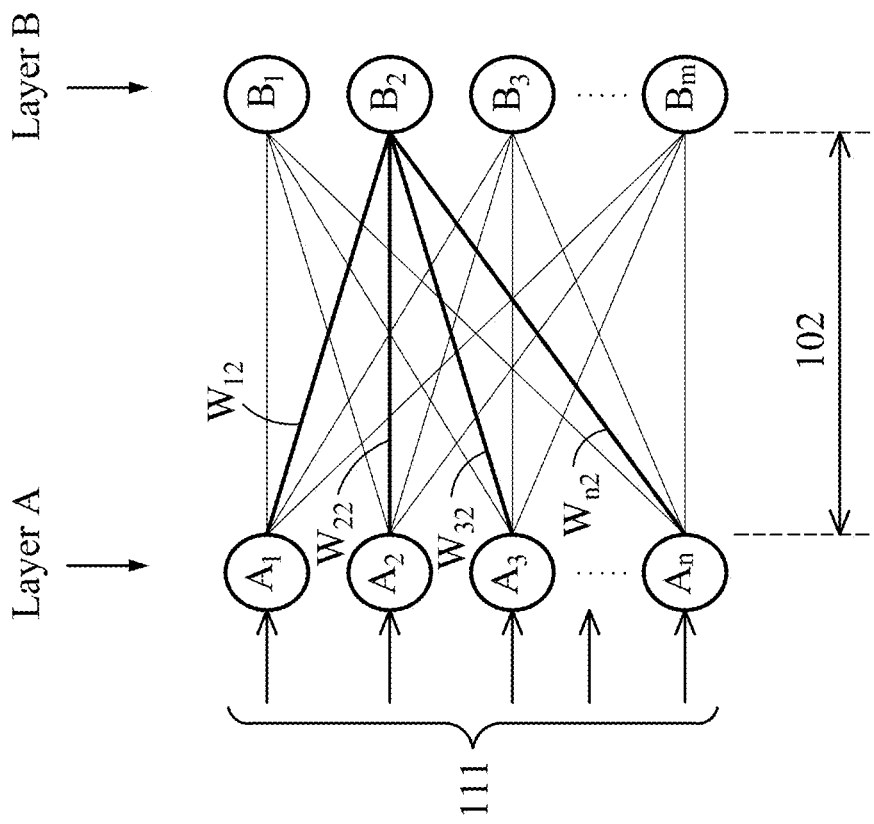
FIG. 1B is a schematic diagram of a portion of the neural network, in accordance with some embodiments.

FIG. 1B is a schematic view of the matrix 102 and associated layers A and B of the neural network 100. Other layers C, D, E and matrices 104, 106, 108 are configured similarly to layers A, B and the matrix 102, and are not described in detail herein.

As illustrated in FIG. 1B, layer A comprises n nodes identified as nodes $A_1$, $A_2$, $A_3$ to $A_n$, and layer B comprises m nodes identified as nodes $B_1$, $B_2$, $B_3$ to $B_m$, where n and m are positive integers. In some embodiments, n is equal to m. In one or more embodiments, n is different from m. In at least one embodiment, at least one of n or m is equal to 1, i.e., the corresponding layer has one node (one neuron). Each node of layer A is connected to one or more nodes of layer B, and vice versa. In the example configuration in FIG. 1B, each node of layer A is connected to all nodes of layer B, and vice versa. Other configurations are within the scopes of various embodiments. In the matrix 102, a connection between a node in layer A and another node in layer B has a corresponding weight. For example, a connection between node $A_1$ and node $B_2$ has a weight $W_{12}$, a connection between node $A_2$ and node $B_2$ has a weight $W_{22}$, a connection between node $A_3$ and node $B_2$ has a weight $W_{32}$, and a connection between node $A_n$ and node $B_2$ has a weight $W_{n2}$. In the description herein, a value of a node is denoted by the name of the node. For example, node $A_1$ has value $A_1$, node $B_2$ has value $B_2$, or the like.

In at least one embodiment, value $B_2$ at node $B_2$ is calculated by the following activation function (1):

$$B_2 = A_1 \times W_{12} + A_2 \times W_{22} + A_3 \times W_{32} \ldots + A_n \times W_{n2} \quad (1)$$

A generalized form of activation function (1) is given as the following activation function (2):

$$B_j = \Sigma_{i=1}^{n} A_i \times W_{ij} \quad (2)$$

where i=1, 2, . . . n, j=1, 2, . . . m, and $W_{ij}$ is the weight of the connection connecting node $A_i$ and node $B_j$.

In some embodiments, in addition to weights assigned to the connections in the matrix 102, a bias is further assigned to one or more of the nodes. For example, when a bias b is assigned to node $B_j$, the activation function at node Bj becomes:

$$B_j = b + \Sigma_{i=1}^{n} A_i \times W_{ij} \quad (3)$$

The input data 111 comprise values $A_1$, $A_2$, $A_3$, . . . $A_n$ applied to corresponding nodes $A_1$, $A_2$, $A_3$ to $A_n$. Values $B_1$, $B_2$, $B_3$ to $B_m$ are calculated from input values $A_1$, $A_2$, $A_3$, . . . $A_n$ and the corresponding weights Wu based on activation function (2). Calculated values $B_1$, $B_2$, $B_3$ to $B_m$ are then used, together with corresponding weights of connections in the matrix 104, to calculate values at the nodes of layer C by using one or more corresponding activation functions. Values at the nodes in subsequent layers D and E are calculated in a similar manner, resulting in the output data 112 being output from output layer E of the neural network 100. The described activation functions (1) and (2) are examples. Other activation functions for calculating values at nodes in the neural network 100 are within the scopes of various embodiments.

In an example application of the neural network 100, learning or training is performed in the neural network 100 by applying a training set of input data to input layer A, propagating the input data through the neural network 100 by calculating values at various nodes in the neural network 100 as described herein, and collecting a set of output data from the output layer E. The collected set of output data are compared with an expected set of output data to determine an amount of error in the collected output data as compared to the expected output data. Based on the determined amount of error, one or more weights of one or more connections in the neural network 100 are adjusted with an aim to reduce the amount of error, and the process is repeated with the application of the same or a different training set of input data to the neural network 100 after weight adjustments. When the amount of error falls below a predetermined acceptable level, the neural network 100 is considered trained and can now be used to process actual input data. For example, when the neural network 100 has been trained to perform image processing, the trained neural network 100 processes one or more input images, and outputs, e.g., one or more faces recognized from the input images. The described training process and application of the neural network 100 are examples. Other applications and/or training processes are within the scopes of various embodiments.

In some embodiments, at least one matrix 102, 104, 106, 108 of connections in the neural network 100 is implemented by an array of resistors each corresponding to a weight of a connection, as described herein.

Figure 2:
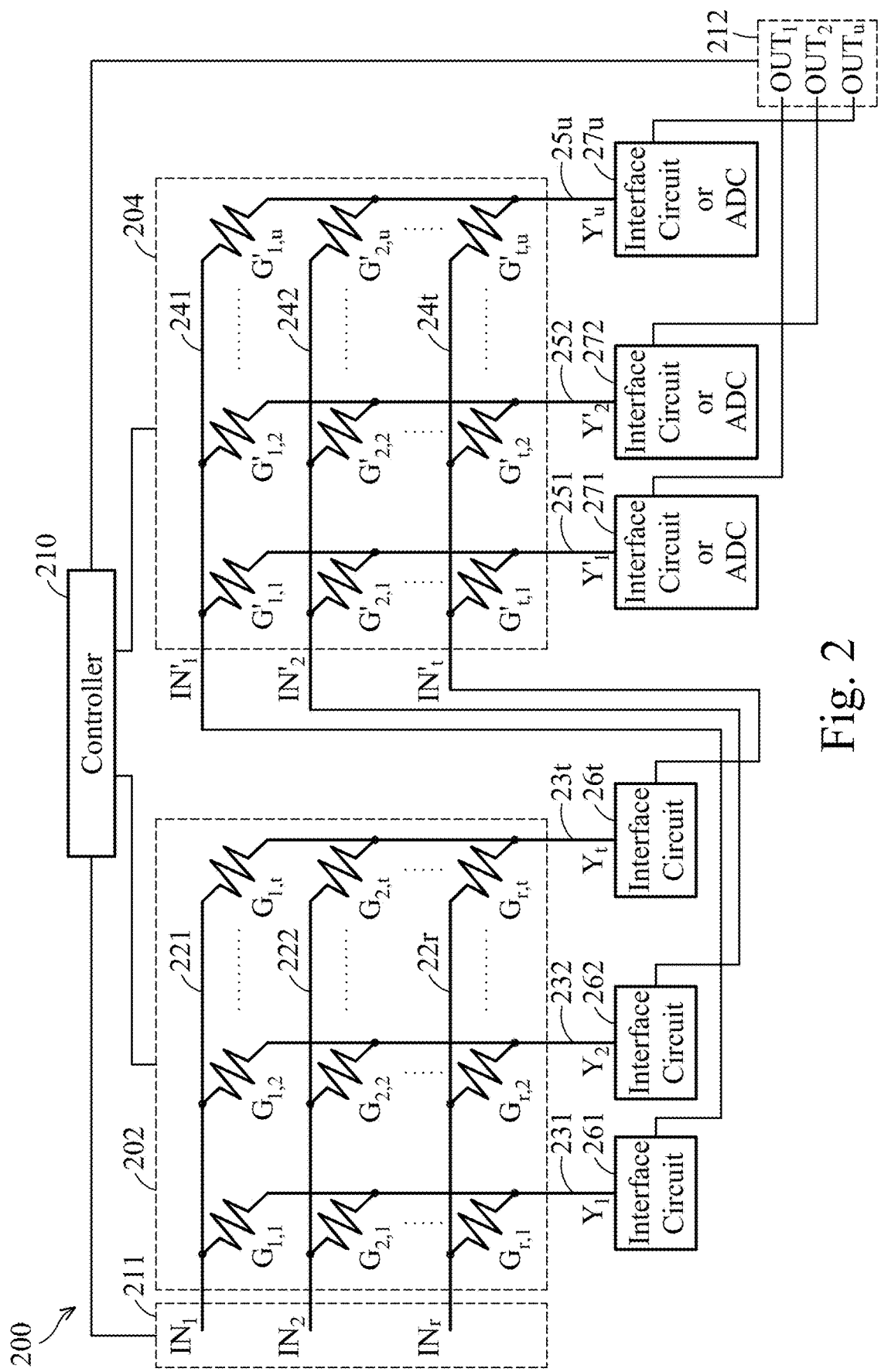
FIG. 2 is a schematic diagram of an integrated circuit, in accordance with some embodiments.

FIG. 2 is a schematic diagram of an integrated circuit (IC) 200, in accordance with some embodiments. In at least one embodiment, the IC 200 is configured as a neural network, or as a portion of a neural network as described with respect to FIGS. 1A-1B.

The IC 200 comprises a first array of resistors (or resistor array) 202, a second resistor array 204, and a controller 210.

The resistor array 202 is an r×t array, where r and t are positive integers, with r input conductive lines 221, 222, . . . 22r, and t output conductive lines 231, 232, . . . 23t. The resistor array 202 comprises a plurality of resistors. Each resistor of the resistor array 202 is electrically coupled between a corresponding input conductive line 22k (where k is 1, 2, . . . r) and a corresponding output conductive line 25l (where l is 1, 2, . . . t), and is indicated in FIG. 2 by a corresponding conductance $G_{k,l}$ of the resistor. For example, a resistor electrically coupled between the input conductive line 221 and the output conductive line 231 is indicated in FIG. 2 by the corresponding conductance $G_{1,1}$. For another example, a resistor electrically coupled between the input conductive line 22r and the output conductive line 23t is indicated in FIG. 2 by the corresponding conductance $G_{r,t}$.

The resistor array 204 is a t×u array, where u is a positive integer, with t input conductive lines 241, 242, . . . 24t, and u output conductive lines 251, 252, . . . 25u. The resistor array 204 comprises a plurality of resistors. Each resistor of the resistor array 204 is electrically coupled between a corresponding input conductive line 24k' (where k' is 1, 2, . . . t) and a corresponding output conductive line 25l' (where l' is 1, 2, . . . u), and is indicated in FIG. 2 by a corresponding conductance $G'_{k',l'}$ of the resistor. For example, a resistor electrically coupled between the input conductive line 24t and the output conductive line 251 is indicated in FIG. 2 by the corresponding conductance $G'_{1,1}$. For another example, a resistor electrically coupled between the input conductive line 24t and the output conductive line 25u is indicated in FIG. 2 by the corresponding conductance $G'_{t,u}$.

In some embodiments, at least one resistor in at least one of the resistor arrays 202, 204 is a controllably variable resistor having a conductance adjustable or programmable, e.g., under control of the controller 210. Example configurations of controllably variable resistors include, but are not limited to, static random-access memory (SRAM), resistive RAM (RRAM), magnetoresistive RAM (MRAM), phase change RAM (PCRAM), spin transfer torque RAM (STTRAM), floating-gate metal-oxide-semiconductor field-effect transistors (FGMOS), spintronics, or the like.

The controller 210 is electrically coupled to the resistor arrays 202, 204, and is configured to adjust the conductance of at least one resistor in the resistor arrays 202, 204, as described herein. In at least one embodiment, the controller 210 is further configured to apply input data 211 to the resistor array 202 and/or to process output data 212 output from the resistor array 204. Example hardware configurations of the controller 210 include, but are not limited to, a processor, a central processing unit (CPU), a multi-processor, a distributed processing system, an application specific integrated circuit (ASIC), or a computer system as described with respect to FIG. 7.

The IC 200 further comprises a plurality of interface circuits 261, 262, . . . 26t, each electrically coupled between a corresponding output conductive line 231, 232, . . . 23t of the resistor array 202 and a corresponding input conductive line 241, 242, ... 24*t* of the resistor array 204. For example, the interface circuit 261 is electrically coupled between the output conductive line 231 of the resistor array 202 and the input conductive line 241 of the resistor array 204. For another example, the interface circuit 26*t* is electrically coupled between the output conductive line 23*t* of the resistor array 202 and the input conductive line 24*t* of the resistor array 204.

The IC 200 further comprises a plurality of circuits 271, 272, ... 27*u* electrically coupled correspondingly to the output conductive lines 251, 252, ... 25*u* of the resistor array 204. The circuits 271, 272, ... 27*u* comprise ADCs or interface circuits similar to interface circuits 261, 262, ... 26*t*. In the example configuration in FIG. 2, the resistor array 204 comprises the output layer of a neural network configured by the IC 200, and the circuits 271, 272, ... 27*u* comprise ADCs configured to output corresponding digital signals $OUT_1$, $OUT_2$, ... $OUT_u$ in the output data 212 to be processed by the controller 210. In one or more embodiments, the resistor array 204 does not comprise the output layer of the neural network and the IC 200 further comprises a further resistor array which corresponds to the matrix 104 in FIG. 1A and is electrically coupled to the output conductive lines 251, 252, ... 25*u* of the resistor array 204 through the corresponding circuits 271, 272, ... 27*u*. In such embodiments, the circuits 271, 272, ... 27*u* are interface circuits similar to interface circuits 261, 262, ... 26*t*.

In some embodiments, resistors in at least one of the resistor arrays 202, 204 correspond to connections in a matrix described with respect to FIGS. 1A, 1B. For example, in at least one embodiment, the resistors in the resistor array 202 correspond to the connections in the matrix 102, and conductance $G_{k,l}$ of a resistor in the resistor array 202 corresponds to weight Wu of the corresponding connection in the matrix 102. The input conductive lines 221, 222, ... 22*r* of the resistor array 202 correspond to nodes $A_1$, $A_2$, ... $A_n$ in layer A of the neural network 100. The output conductive lines 231, 232, ... 23*t* of the resistor array 202 correspond to nodes $B_1$, $B_2$, ... $B_m$ in layer B of the neural network 100. Further, the resistors in the resistor array 204 correspond to the connections in the matrix 104, and conductance $G'_{k,l}$ of a resistor in the resistor array 204 corresponds to the weight of the corresponding connection in the matrix 104. The input conductive lines 241, 242, ... 24*t* of the resistor array 204 correspond to nodes $B_1$, $B_2$, ... $B_m$ in layer B of the neural network 100. The output conductive lines 251, 252, ... 25*u* of the resistor array 204 correspond to the nodes in layer C of the neural network 100.

The input data 211 input to the resistor array 202 corresponds to the input data 111 input to layer A. Input signals $IN_1$, $IN_2$, ... $IN_r$ in the input data 211 correspond to values $A_1$, $A_2$, ... $A_n$ input to the corresponding nodes in layer A. In at least one embodiment, input signals $IN_1$, $IN_2$, ... $IN_r$ comprise analog voltages. In some embodiments, input signals $IN_1$, $IN_2$, ... $IN_r$ comprise voltage pulses of corresponding digital signals. In the description herein, a voltage of a signal is denoted by the name of the signal. For example, input signal $IN_1$ has a voltage $IN_1$, input signal $IN_r$ has a voltage $IN_r$, or the like.

The voltage of each of input signals $IN_1$, $IN_2$, ... $IN_r$ causes a corresponding current to flow from a corresponding input conductive line 22*k* through a corresponding resistor $G_{k,l}$ of the resistor array 202 to a corresponding output conductive line 231. For example, the voltage of input signal $IN_1$ causes a corresponding current $IN_1 \times G_{1,2}$ to flow from the input conductive line 221 through resistor $G_{1,2}$ to the output conductive line 232, the voltage of input signal $IN_2$ causes a corresponding current $IN_2 \times G_{2,2}$ to flow from the input conductive line 222 through resistor $G_{2,2}$ to the output conductive line 232, and the voltage of input signal $IN_r$ causes a corresponding current $IN_r \times G_{r,2}$ to flow from the input conductive line 22*r* through resistor $G_{r,2}$ to the output conductive line 232. The sum of the currents $IN_1 \times G_{1,2} + IN_2 \times G_{2,2} + ... IN_r \times G_{r,2}$ that flow from the input conductive lines 221, 222, ... 22*r* to the output conductive line 232 is denoted as signal $Y_2$ on the output conductive line 232. In at least one embodiment, signal $Y_2$ corresponds to value $B_2$ of the corresponding node as described with respect to FIG. 1B. Signal $Y_1$ on the output conductive line 231 is the sum of the currents that are caused by input signals $IN_1$, $IN_2$, ... $IN_r$ to flow from the input conductive lines 221, 222, ... 22*r* to the output conductive line 231. Signal $Y_t$ on the output conductive line 23*t* is the sum of the currents that are caused by input signals $IN_1$, $IN_2$, ... $IN_r$ to flow from the input conductive lines 221, 222, ... 22*r* to the corresponding output conductive line 23*t*. Signals $Y_1$, $Y_2$, ... $Y_t$ correspond to values of various nodes in layer B of the neural network 100. In other words, the resistor array 202 is configured to perform the calculation of activation function (1) or (2) simply by applying input signals $IN_1$, $IN_2$, ... $IN_r$ to the corresponding input conductive lines 221, 222, ... 22*r* to obtain signals $Y_1$, $Y_2$, ... $Y_t$ on the corresponding output conductive lines 231, 232, ... 23*t*.

Each of the interface circuits 261, 262, ... 26*t* is configured to receive the corresponding signal $Y_1$, $Y_2$, ... $Y_t$ on the corresponding output conductive line 231, 232, ... 23*t* of the resistor array 202, and apply an analog voltage $IN'_1$, $IN'_2$, ... $IN'_t$ corresponding to the signal $Y_1$, $Y_2$, ... $Y_t$ to the corresponding input conductive line 241, 242, ... 24*t* of the resistor array 204. As a result, data transfer is performed between outputs of the resistor array 202 and inputs of the resistor array 204. This data transfer is equivalent, in one or more embodiments, to the data transfer between matrices 102, 104 through nodes $B_1$, $B_2$, ... $B_m$ in layer B of the neural network 100.

The analog voltages $IN'_1$, $IN'_2$, ... $IN'_t$ on the input conductive line 241, 242, ... 24*t* of the resistor array 204 cause currents to flow from the input conductive line 241, 242, ... 24*t* to the output conductive lines 251, 252, ... 25*u* through corresponding resistors of the resistor array 204. Signal $Y'_1$ on the output conductive line 251 is the sum of the currents that are caused by the analog voltages $IN'_1$, $IN'_2$, ... $IN'_t$ to flow from the input conductive lines 241, 242, ... 24*t* to the output conductive line 251. Signal $Y'_2$ on the output conductive line 252 is the sum of the currents that are caused by the analog voltages $IN'_1$, $IN'_2$, ... $IN'_t$ to flow from the input conductive lines 241, 242, ... 24*t* to the output conductive line 252. Signal $Y'_u$ on the output conductive line 25*u* is the sum of the currents that are caused by the analog voltages $IN'_1$, $IN'_2$, ... $IN'_t$ to flow from the input conductive lines 241, 242, ... 24*t* to the output conductive line 25*u*.

In one or more embodiments where the circuits 271, 272, ... 27*u* are interface circuits, the circuits 271, 272, ... 27*u* are configured to convert signals $Y'_1$, $Y'_2$, ... $Y'_u$ to further analog voltages to be input to a subsequent resistor array. In some embodiments where the circuits 271, 272, ... 27*u* are ADCs, the circuits 271, 272, ... 27*u* are configured to convert signals $Y'_1$, $Y'_2$, ... $Y'_u$ to digital signals $OUT_1$, $OUT_2$, ... $OUT_u$ to be processed by the controller 210.

In some embodiments, the controller 210 is configured to determine an amount of error between obtained and expected output data as described herein, and, based on the determined amount of error, adjust the conductance of at least one resistor in the resistor arrays 202, 204. Conductance adjustments in the IC 200 correspond to the described weight adjustments in the neural network 100. An example configuration for conductance adjustment is described with respect to FIG. 3.

The described configuration and/or operation of the IC 200 are examples. Other configurations and/or operations are within the scopes of various embodiments. In at least one embodiment, the IC 200 comprises more than two resistor arrays. In one or more embodiments, the resistor array 202 corresponds to a matrix of connections between two hidden layers of a neural network. In such embodiments, signals $IN_1$, $IN_2$, ... $IN_r$ are analog voltages output by a further resistor array preceding the resistor array 202.

As described herein, the IC 200 in accordance with some embodiments comprises interface circuits 261, 262, ... 26t configured to provide signals $Y_1$, $Y_2$, ... $Y_t$ at output conductive lines 231, 232, ... 23t of the resistor array 202 as analog voltages $IN'_1$, $IN'_2$, ... $IN'_t$ to input conductive lines 241, 242, ... 24t of the resistor array 204. As a result, it is possible in at least one embodiment to quickly and efficiently perform data transfer between successive layers in a corresponding neural network, without performing analog-to-digital conversion or requiring ADCs. In one or more embodiments, the IC 200 achieves one or more of increased processing speed, reduced chip area cost, or reduced power consumption, compared to other approaches that include ADCs or perform analog-to-digital conversion between successive resistor arrays.

Figure 3:
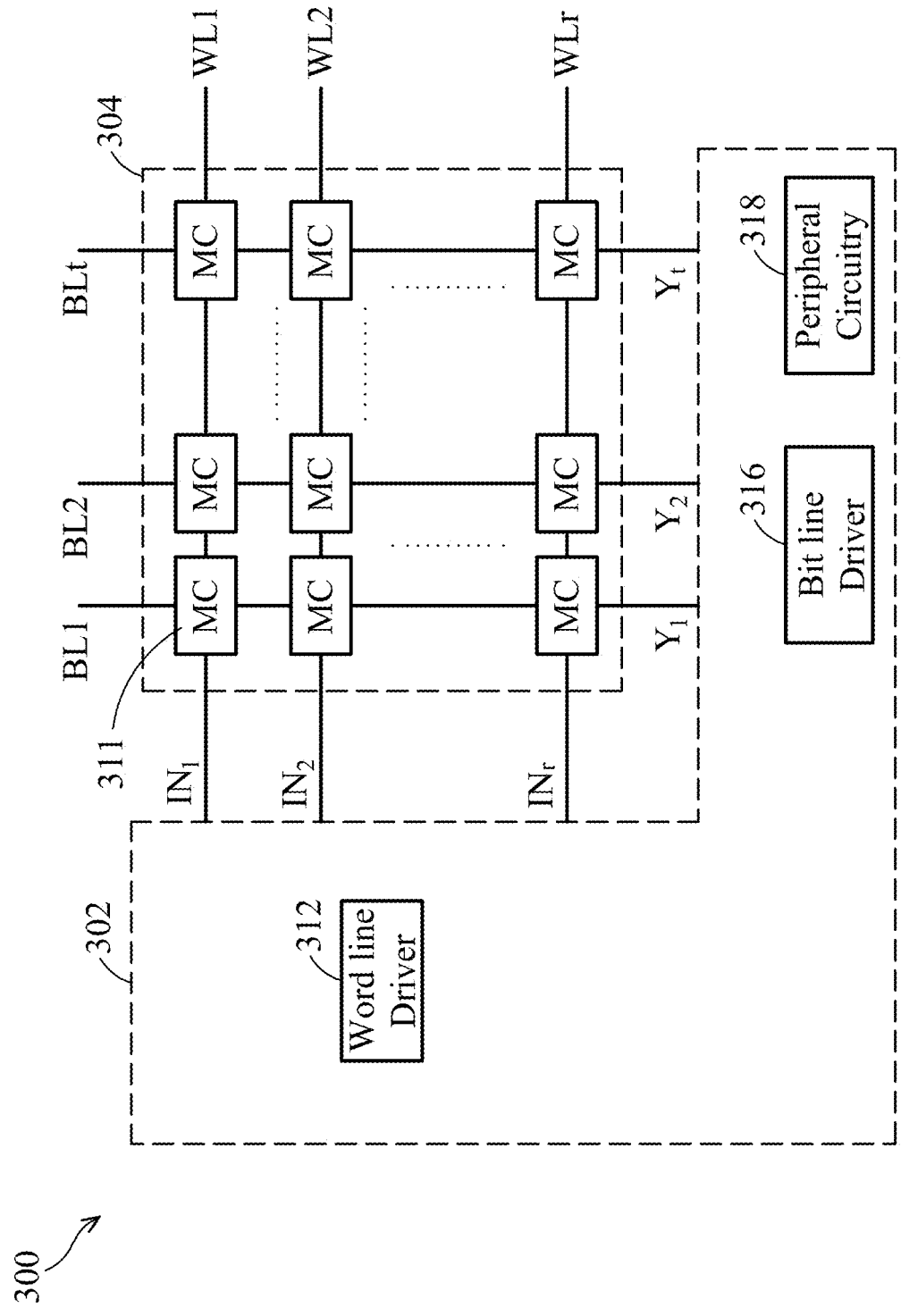
FIG. 3 is a schematic diagram of a memory device, in accordance with some embodiments.

FIG. 3 is a schematic diagram of a memory device 300, in accordance with some embodiments. In some embodiments, the memory device 300 configures one or more of the matrices 102, 104, 106, 108 described with respect to FIG. 1A, or resistor arrays 202, 204 described with respect to FIG. 2.

The memory device 300 comprises a plurality of memory cells MC, and a memory controller 302 electrically coupled to the memory cells MC and configured to control operations of the memory cells MC including, but not limited to, a read operation, a write operation, or the like. Write operations include, but are not limited to, programming operation, set operation, reset operations, or the like. In at least one embodiment, the memory controller 302 corresponds to the controller 210 described with respect to FIG. 2.

The memory cells MC are arranged in a plurality of columns and rows in a memory array 304. In at least one embodiment, each of the memory cells MC represents a resistor in a resistor array as described with respect to FIG. 2. For example, the memory cell 311 represents a resistor corresponding to the resistor $G_{1,1}$ in the resistor array 202 of the IC 200.

The memory device 300 further comprises a plurality of word lines (also referred to as "address lines") WL1 to WLr extending along the rows, and a plurality of bit lines (also referred to as "data lines") BL1 to BLt extending along the columns of the memory cells MC. Each of the memory cells MC is electrically coupled to the memory controller 302 by at least one of the word lines, and at least one of the bit lines. In some example operations, word lines are configured for transmitting addresses of the memory cells MC to be read from, or for transmitting addresses of the memory cells MC to be written to, or the like. In at least one embodiment, a set of word lines is configured to perform as both read word lines and write word lines. Examples of bit lines include read bit lines for transmitting data read from the memory cells MC indicated by corresponding word lines, write bit lines for transmitting data to be written to the memory cells MC indicated by corresponding word lines, or the like. In at least one embodiment, a set of bit lines is configured to perform as both read bit lines and write bit lines. The word lines are commonly referred to herein as WL, and the bit lines are commonly referred to herein as BL. Various numbers of word lines and/or bit lines in the memory array 304 are within the scope of various embodiments. In some embodiments, each memory cell MC is coupled to additional conductive lines, such as source lines and/or drain lines. Example memory types of the memory cells MC include, but are not limited to, SRAM, RRAM, MRAM, PCRAM, STTRAM), or the like. In one or more example embodiments described herein, the memory cells MC include RRAM memory cells.

In the example configuration in FIG. 3, the controller 302 comprises a word line driver 312, a bit line driver 316, and peripheral circuitry 318. In at least one embodiment, the controller 302 further includes one or more clock generators for providing clock signals for various components of the memory device 300, one or more input/output (I/O) circuits for data exchange with external devices, and/or one or more controllers for controlling various operations in the memory device 300.

The word line driver 312 is coupled to the memory array 304 via the word lines WL. The word line driver 312 is configured to decode a row address of the memory cell MC selected to be accessed in a read operation or a write operation. The word line driver 312 is configured to supply a voltage to the selected word line WL corresponding to the decoded row address, and a different voltage to the other, unselected word lines WL. The bit line driver 316 is coupled to the memory array 304 via the bit lines BL. The bit line driver 316 is configured to decode a column address of the memory cell MC selected to be accessed in a read operation or a write operation. The bit line driver 316 is configured to supply a voltage to the selected bit line BL corresponding to the decoded column address, and a different voltage to the other, unselected bit lines BL. The peripheral circuitry 318 is coupled to the memory array 304 via the bit lines BL, and comprises interface circuits or ADCs corresponding to those described with respect to FIG. 2.

In at least one embodiment, each memory cell MC corresponds to a resistor in the resistor array 202, 204, the word lines WL correspond to the input conductive lines 221, 222, ... 22r or the input conductive lines 241, 242, ... 24t, and the bit lines BL correspond to the output conductive lines 231, 232, ... 23t or the output conductive lines 251, 252, ... 25u. In some embodiments, each memory cell MC has two possible states corresponding to two conductance values of a corresponding resistor, or corresponding to two weight values of a connection in a neural network. In at least one embodiment, each memory cell MC has more than two possible states corresponding to more than two conductance values of a corresponding resistor, or corresponding to more than two weight values of a connection in a neural network. In some embodiments, each memory cell MC comprises multiple memory elements coupled together in parallel and/or in series to increase the number of possible states of the memory cell MC, to therefore increase the number of possible weight values of a connection in a neural network. Other configurations are within the scopes of various embodiments.

To switch a memory cell MC between different states, corresponding to conductance adjustment of a corresponding resistor as described herein, one or more write operations are performed by applying predetermined voltages to the bit lines BL and word lines WL. For example, when a memory cell 311 coupled to bit line BL1 and word line WL1 is selected to be accessed or programed in a write operation, a write voltage is applied by the controller 302 across the corresponding selected bit line BL1 and word line WL1, whereas the other, non-selected bit lines BL2-BLt and word lines WL2-WLr are biased at a voltage of about half the write voltage. The write voltage across the selected memory cell 311 is sufficient to switch the memory cell 311 from one logic state (e.g., logic "1") to another logic state (e.g., logic "0") which corresponds to conductance adjustment of a resistor represented by the memory cell 311. The biasing voltages across the other, non-elected memory cells are not sufficient to affect the logic states of the non-elected memory cells, and therefore, conductance values of resistors represented by the other, non-elected memory cells are not adjusted. In some embodiments, more than one memory cells are written to or programed in a common write operation.

To propagate data through the memory array 304 to perform computations corresponding to, for example, activation function (1) or (2) as described, a read operation is performed for the memory cells MC in the memory array 304. For example, the word lines WL1-WLr are selected or enabled by the controller 302 at the same time. Input signals, e.g., $IN_1$-$IN_r$, as described with respect to FIG. 2, are simultaneously applied by the controller 302 to the selected word lines WL1-WLr, and cause corresponding currents to flow, through the memory cells MC of the memory array 304, to the bit lines BL1-BLt. The value of the current flowing through each memory cell MC corresponds to the input signal applied to the corresponding word line WL coupled to the memory cell MC, and also corresponds to the logic state of the memory cell MC, i.e., corresponds to the conductance value of the resistor represented by the memory cell MC. Each of signals $Y_1, Y_2, \ldots Y_t$, as described with respect to FIG. 2, is the sum of the values of the currents flowing through the memory cells MC coupled to a corresponding bit line BL. The signals $Y_1, Y_2, \ldots Y_t$ are supplied to the peripheral circuitry 318. In some embodiments, the peripheral circuitry 318 comprise interface circuits electrically coupled correspondingly to the bit lines BL, and configured to convert the signals $Y_1, Y_2, \ldots Y_t$ into analog voltages to be supplied to a further memory array corresponding to a resistor array successive to the resistor array represented by the memory array 304. In some embodiments, the peripheral circuitry 318 comprise ADCs electrically coupled correspondingly to the bit lines BL, and configured to convert the signals $Y_1, Y_2, \ldots Y_t$ into digital signals to be processed by the controller 302 or another controller corresponding to the controller 210. In some embodiments, the input signals $IN_1$, $IN_2$, $IN_r$ are analog voltages applied from interface circuits associated with another memory array corresponding to a resistor array preceding the resistor array represented by the memory array 304.

The described configuration and/or operation of the memory device 300 are examples. Other configurations and/or operations are within the scopes of various embodiments. For example, in the described example configuration, the bit lines BL and word lines WL are used for both write and read operations. In one or more further embodiments, the bit lines BL and/or the word lines WL are used in write operations, and additional input and/or output conductive lines are coupled to the memory cells MC to be used in read operations. In some other embodiments, the bit lines BL and/or the word lines WL are used as input and/or output conductive lines in read operations, and additional conductive lines are coupled to the memory cells MC to be used in write operations. In at least one embodiment, one or more advantages described herein with respect to the IC 200 are achievable by the memory device 300.

Figure 4:
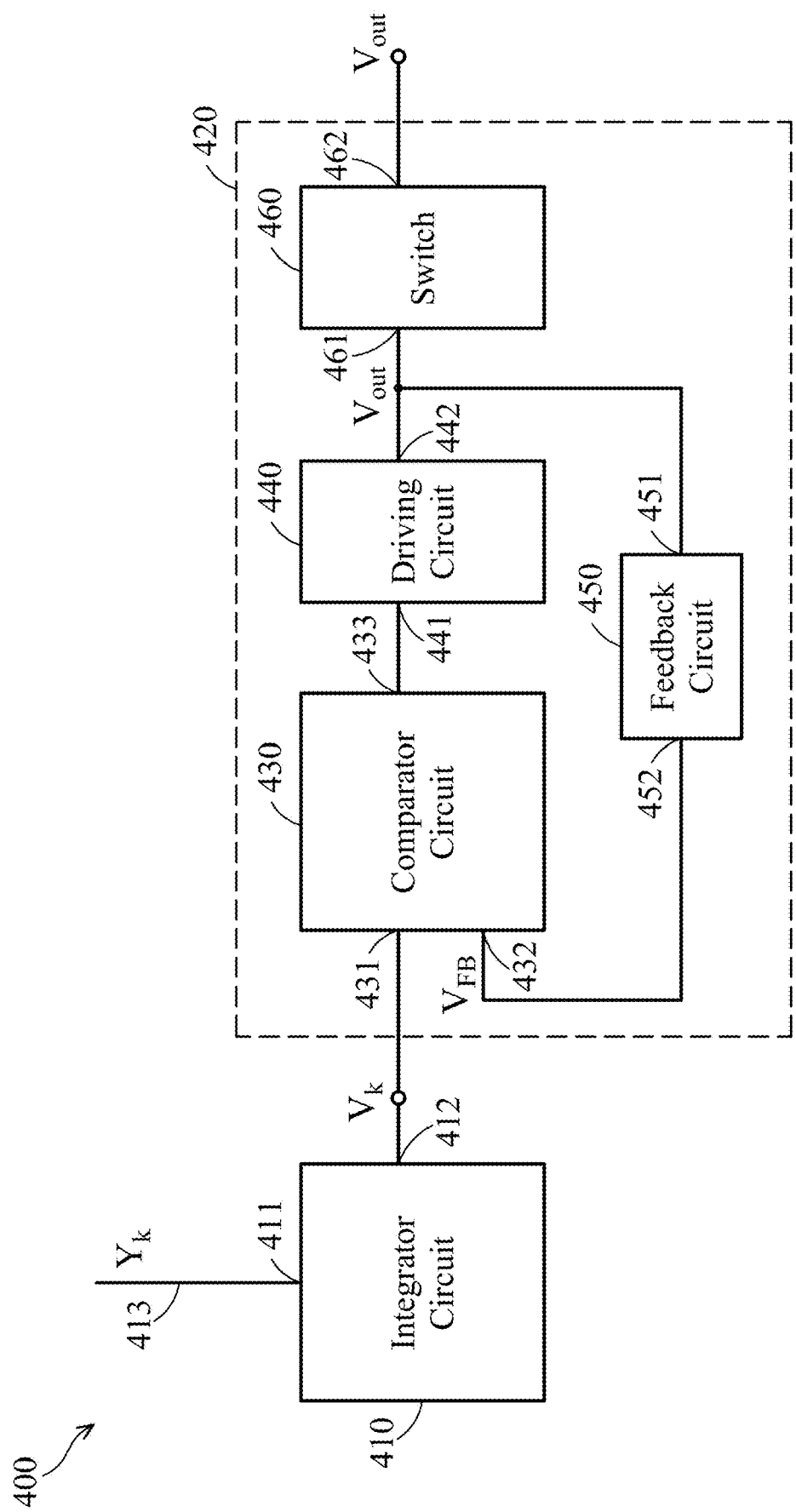
FIG. 4 is a schematic block diagram of an interface circuit, in accordance with some embodiments.

FIG. 4 is a schematic block diagram of an interface circuit 400, in accordance with some embodiments. In some embodiments, the interface circuit 400 corresponds to one or more of the interface circuits described with respect to FIGS. 2, 3. In example embodiments described herein, the interface circuit 400 corresponds to one of the interface circuits 261, 262, . . . 26t.

The interface circuit 400 comprises an integrator circuit 410, and a buffer circuit 420.

The integrator circuit 410 has an input 411 and an output 412. The input 411 is electrically coupled to an output conductive line 413 from a resistor array as described herein. In some embodiments, the output conductive line 413 corresponds to one of the output conductive lines 231, 232, . . . 23t of the resistor array 202, and a signal $Y_k$ corresponding to one of the signals $Y_1, Y_2, \ldots Y_t$ is supplied by the conductive line 413 to the integrator circuit 410. The signal $Y_k$ corresponds to the sum of currents flowing on the conductive line 413 when a set of input data is applied to the input conductive lines of the resistor array, as described herein. The integrator circuit 410 is configured to integrate the signal $Y_k$ over time, e.g., over the duration of a read operation, to generate an intermediate voltage $V_k$ at the output 412.

The buffer circuit 420 is electrically coupled to the output 412 of the integrator circuit 410 to receive the intermediate voltage $V_k$, and is configured to generate an analog voltage $V_{out}$ corresponding to the intermediate voltage $V_k$. In some embodiments, the analog voltage $V_{out}$ is applied to a corresponding input conductive line of a subsequent resistor array. For example, the analog voltage $V_{out}$ is applied, as one of the analog voltages $IN'_1, IN'_2, \ldots IN'_t$, to the corresponding input conductive lines 241, 242, . . . 24t of the resistor array 204, as described herein.

In the example configuration in FIG. 4, the buffer circuit 420 comprises a comparator circuit 430, a driving circuit 440, a feedback circuit 450, and a switch 460. The comparator circuit 430 has a first input 431, a second input 432, and an output 433. The driving circuit 440 has an input 441 and an output 442. The feedback circuit 450 has an input 451 and an output 452. The switch 460 has a first end 461, and a second end 462. The first input 431 of the comparator circuit 430 is electrically coupled to the output 412 of the integrator circuit 410 to receive the intermediate voltage $V_k$. The second input 432 of the comparator circuit 430 is electrically coupled to the output 452 of the feedback circuit 450 to receive a feedback voltage $V_{FB}$. The comparator circuit 430 is configured to compare the intermediate voltage $V_k$ at the first input 431 with the feedback voltage $V_{FB}$ at the second input 432, and output a result of the comparison as a control signal at the output 433. The input 441 of the driving circuit 440 is electrically coupled to the output 433 of the comparator circuit 430 to receive the control signal. The driving circuit 440 is configured to generate the analog voltage $V_{out}$ at the output 442. The input 451 of the feedback circuit 450 is electrically coupled to the output 442 of the driving circuit 440 to receive the analog voltage $V_{out}$. The feedback circuit 450 is configured to generate the feedback voltage $V_{FB}$ corresponding to the analog voltage $V_{out}$ at the output 452, to apply the feedback voltage $V_{FB}$ to the second input 432 of the comparator circuit 430. The first end 461 of the switch 460 is electrically coupled to the output 442 of the driving circuit 440. The second end 462 of the switch 460 configures an output of the buffer circuit 420.

When the switch 460 is closed, the analog voltage $V_{out}$ is output from the buffer circuit 420 to be applied to a corresponding input conductive line in the subsequent resistor array. When the switch 460 is open, the analog voltage $V_{out}$ is not output from the buffer circuit 420. A reason for controlling the switch 460 to be open is to ensure stable or correct operation of the interface circuit 400, buffer circuit 420, or other circuitry that is electrically coupled to the output of the buffer circuit 420. In some embodiments, the switch 460 is controlled to be closed or open by a controller as described. In at least one embodiment, the switch 460 is omitted.

The comparator circuit 430 is configured to control the driving circuit 440 to generate the analog voltage $V_{out}$ in accordance with a result of the comparison between the intermediate voltage $V_k$ and the feedback voltage $V_{FB}$. For example, when the feedback voltage $V_{FB}$ is smaller than the intermediate voltage $V_k$, the control signal output by the comparator circuit 430 to the input 441 of the driving circuit 440 causes the driving circuit 440 to increase the analog voltage $V_{out}$. When the feedback voltage $V_{FB}$ is greater than the intermediate voltage $V_k$, the control signal output by the comparator circuit 430 to the input 441 of the driving circuit 440 causes the driving circuit 440 to decrease the analog voltage $V_{out}$. In either case, the difference between the intermediate voltage $V_k$ and the feedback voltage $V_{FB}$ is decreased, and the corresponding control signal causes the driving circuit 440 to move a voltage value of the analog voltage $V_{out}$ toward a stable voltage value. The stable voltage value of the analog voltage $V_{out}$, or a stable state of the driving circuit 440, is reached when the feedback voltage $V_{FB}$ becomes equal to the intermediate voltage $V_k$. In other words, the buffer circuit 420 is configured to force the feedback voltage $V_{FB}$ (which corresponds to the analog voltage $V_{out}$) to be aligned with the intermediate voltage $V_k$, in one or more embodiments. At the stable state, the analog voltage $V_{out}$ corresponds to the intermediate voltage $V_k$ and the signal $Y_k$ on the conductive line 413. As a result, when the analog voltage $V_{out}$ is applied to a corresponding input conductive line of a subsequent resistor array, data transfer from the resistor array which outputs the signal $Y_k$ and the subsequent resistor array is quickly and efficiently achieved, in at least one embodiment.

A reason the buffer circuit 420 is included in the interface circuit 400 in accordance with some embodiments is that the intermediate voltage $V_k$, while corresponding to the signal $Y_k$ output from the resistor array, does not have sufficient current loading capability in some situations. As described with respect to FIG. 2, a voltage applied to an input conductive line of a resistor array is also applied to multiple resistors coupled to the input conductive line. In some situations, if the intermediate voltage $V_k$ is directly applied to an input conductive line of the subsequent resistor array, the current loading capability at the output 412 of the integrator circuit 410 may not be sufficient to drive a large number of resistors coupled to the input conductive line, causing the intermediate voltage $V_k$ to drop and resulting in inaccurate operation of the interface circuit 400. In some embodiments, the driving circuit 440 in the buffer circuit 420 is configured to provide sufficient current loading capability to ensure that the analog voltage $V_{out}$ does not drop and remains stable even when the analog voltage $V_{out}$ is applied to multiple resistors coupled to the corresponding input conductive line in the subsequent resistor array. In at least one embodiment, one or more advantages described herein with respect to the IC 200 and/or memory device 300 are achievable by the interface circuit 400.

Figure 5A:
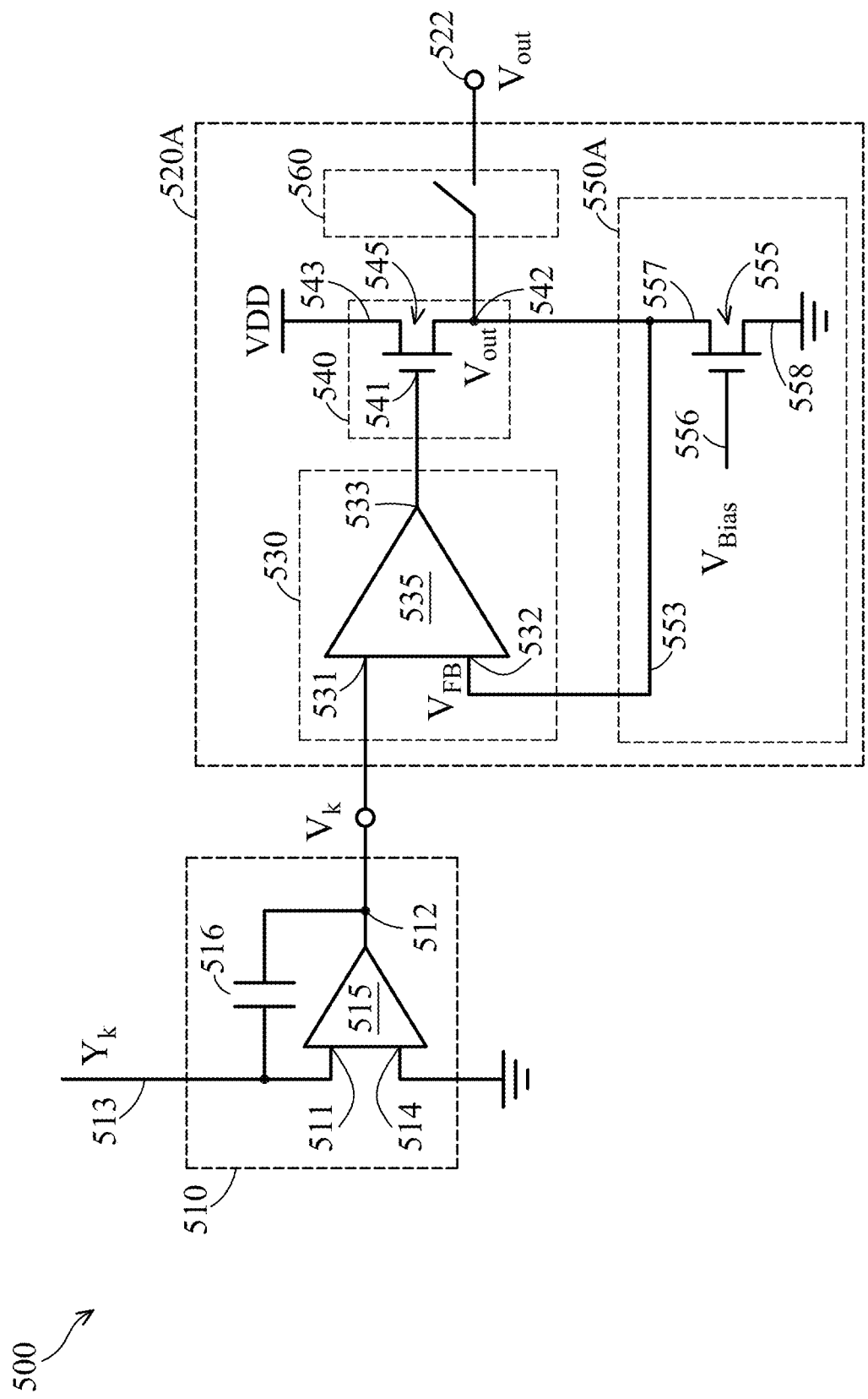
FIG. 5A is a schematic circuit diagram of an interface circuit, in accordance with some embodiments.

FIG. 5A is a schematic circuit diagram of an interface circuit 500, in accordance with some embodiments. In at least one embodiment, the interface circuit 500 corresponds to the interface circuit 400, or one or more of the interface circuits described with respect to FIGS. 2, 3. Components in FIG. 5A having corresponding components in FIG. 4 are designated by the reference numerals of FIG. 4 increased by 100.

The interface circuit 500 comprises an integrator circuit 510, and a buffer circuit 520A. The buffer circuit 520A comprises a comparator circuit 530, a driving circuit 540, a feedback circuit 550A, and a switch 560.

The integrator circuit 510 comprises an operational amplifier 515 and a capacitor 516. An input 511 of the operational amplifier 515 is electrically coupled to an output conductive line 513 from a resistor array to receive a signal $Y_k$, as described herein. A further input 514 of the operational amplifier 515 is grounded. The capacitor 516 is electrically coupled between the input 511 and an output 512 of the operational amplifier 515. The operational amplifier 515 and the capacitor 516 are configured to integrate the signal $Y_k$ over time to generate an intermediate voltage $V_k$. The described configuration of the integrator circuit 510 is an example. Other integrator circuit configurations are within the scopes of various embodiments.

The comparator circuit 530 comprises an operational amplifier 535. A first input 531 of the operational amplifier 535 is electrically coupled to the output 512 of the operational amplifier 515 to receive the intermediate voltage $V_k$. A second input 532 of the operational amplifier 535 is electrically coupled to the feedback circuit 550A to receive a feedback voltage $V_{FB}$. The operational amplifier 535 is configured to compare the intermediate voltage $V_k$ at the first input 531 with the feedback voltage $V_{FB}$ at the second input 532, and output a result of the comparison as a control signal at an output 533 of the operational amplifier 535. The described configuration of the comparator circuit 530 is an example. Other comparator circuit configurations are within the scopes of various embodiments.

The driving circuit 540 comprises a transistor 545. The transistor 545 has a gate terminal 541 electrically coupled to the output 533 of the operational amplifier 535 to receive the control signal. The transistor 545 further has a first source/drain terminal 542 configuring the output of the driving circuit 540, and a second source/drain terminal 543 electrically coupled to a node of a power supply voltage VDD. The transistor 545 is configured to generate the analog voltage $V_{out}$ at the output 542, based on the control signal at the gate terminal 541. Examples of transistor 545 include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In some embodiments, the transistor 545 is a p-channel metal-oxide semiconductor (PMOS) transistor, the first source/drain terminal 542 is a drain of the PMOS transistor, the second source/drain terminal 543 is a source of the PMOS transistor, the first input 531 of the operational amplifier 535 is an inverting input, and the second input 532 of the operational amplifier 535 is a non-inverting input. In some embodiments, the transistor 545 is an n-channel metal-oxide semiconductor (NMOS) transistor, the first source/drain terminal 542 is a source of the NMOS transistor, the second source/drain terminal 543 is a drain of the NMOS transistor, the first input 531 of the operational amplifier 535 is a non-inverting input, and the second input 532 of the operational amplifier 535 is an inverting input. The power provided by VDD ensures sufficient current loading capability of the driving circuit 540, as described herein. The described configuration of the driving circuit 540 is an example. Other driving circuit configurations are within the scopes of various embodiments.

The feedback circuit 550A comprises a connector 553 and a transistor 555. The connector 553 has a first end electrically coupled to the output 542 of the driving circuit 540, and a second end electrically coupled to the second input 532 of the operational amplifier 535. The transistor 555 has a controllable gate terminal 556 configured to receive a bias voltage $V_{Bias}$, a first source/drain terminal 557 electrically coupled to the output 542 of the driving circuit 540 and the first end of the connector 553, and a second source/drain terminal 558 which is grounded. The connector 553 applies the analog voltage $V_{out}$ as the feedback voltage $V_{FB}$ to the second input 532 of the operational amplifier 535. In other words, $V_{FB}=V_{out}$ in the example configuration in FIG. 5A. The buffer circuit 520A reaches a stable state when $V_{FB}=V_{out}=V_k$. The transistor 555 is configured to provide an appropriate tail current for the operational amplifier 535 to be stable in a standby state, and/or to prevent breakdown of circuit elements due to excessive currents. In some embodiments, the bias voltage $V_{Bias}$ is provided by a controller as described herein, and/or is adjustable depending on one or more operating conditions of the interface circuit 500. In at least one embodiment, the transistor 555 is a PMOS transistor. In some embodiments, the transistor 555 is an NMOS transistor. The described configuration of the feedback circuit 550A is an example. Other feedback circuit configurations are within the scopes of various embodiments.

The switch 560 is electrically coupled between the output 542 of the driving circuit 540 and an output 522 of the interface circuit 500. The switch 560 is configured to selectively or controllably isolate the interface circuit 500 from other circuitry for one or more reasons discussed herein. In some embodiments, the switch 560 is controlled to be closed or open by a controller. For example, the switch 560 comprises a transistor having a gate terminal controlled by a controller. In at least one embodiment, the transistor of the switch 560 is a PMOS transistor. In some embodiments, the transistor of the switch 560 is an NMOS transistor. The described configuration of the switch 560 is an example. Other switch configurations are within the scopes of various embodiments. In at least one embodiment, the switch 560 is omitted.

In some embodiments, the interface circuit 500 is configured to operate in a manner described with respect to the interface circuit 400. Compared to ADCs used in other approaches for data conversion and/or data transfer between successive layers or resistor arrays, the buffer circuit 520A has a smaller footprint, lower power consumption, and shorter latency (i.e., faster speed). In some embodiments, the buffer circuit 520A has a footprint of about 10 times smaller than an ADC, and power consumption of about 100 times lower than an ADC. In at least one embodiment, one or more advantages described herein with respect to one or more of the IC 200, the memory device 300, or the interface circuit 400, are achievable by the interface circuit 500.

Figure 5C:
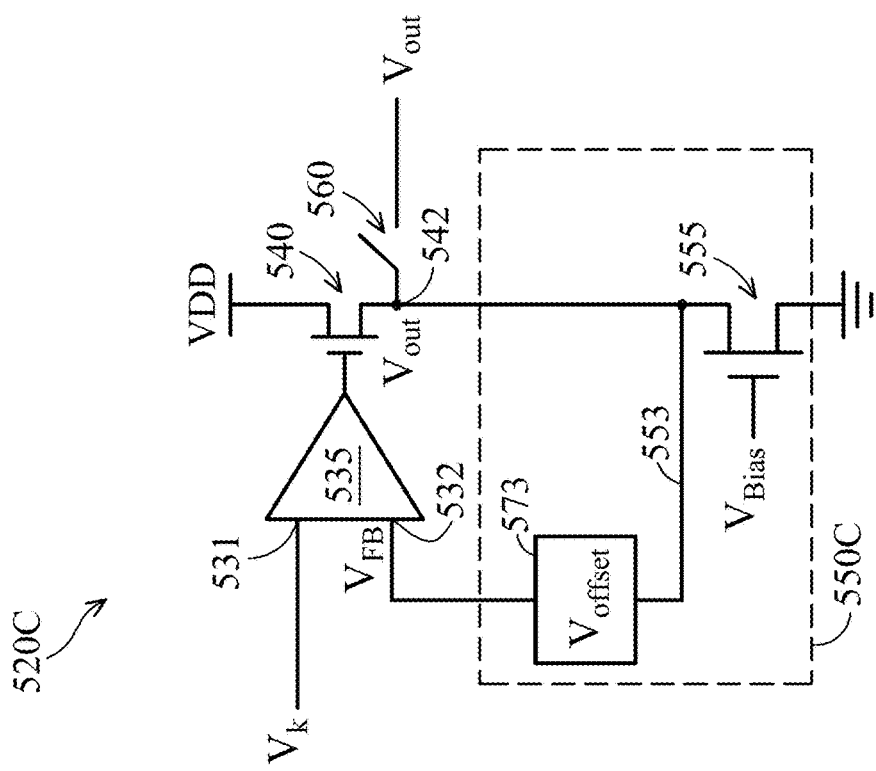
FIGS. 5B and 5C are schematic circuit diagrams of various buffer circuits, in accordance with some embodiments.
Figure 5B:
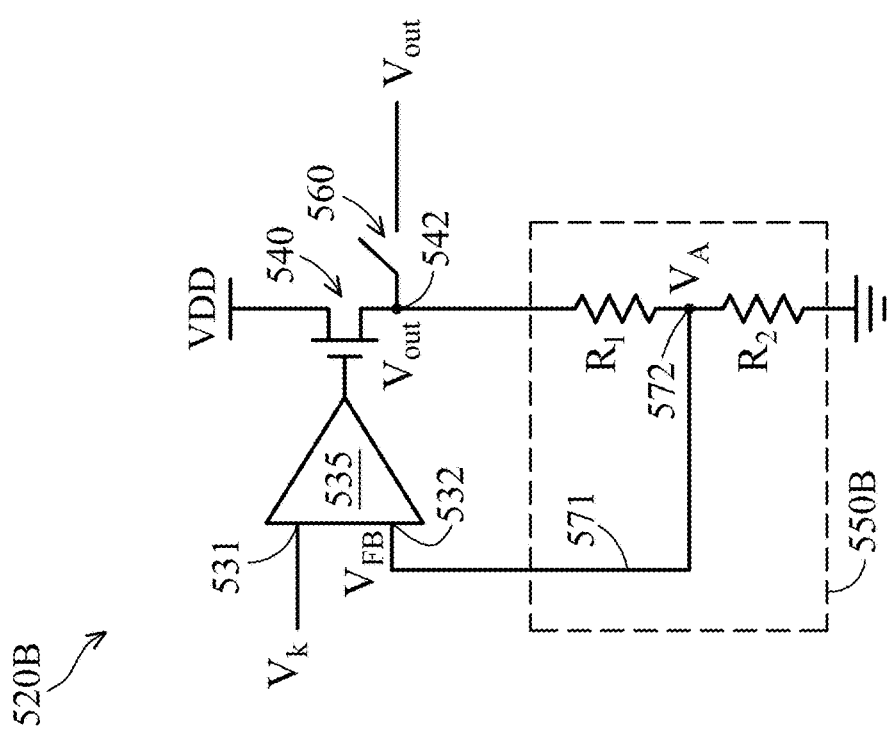

FIG. 5B is schematic circuit diagram of a buffer circuit 520B, in accordance with some embodiments. In some embodiments, the buffer circuit 520B is electrically coupled to the integrator circuit 510 to receive the intermediate voltage $V_k$ and configure an interface circuit corresponding to the interface circuit 500. Components in FIG. 5B having corresponding components in FIG. 5A are designated by the same reference numerals as in FIG. 5A.

The buffer circuit 520B in FIG. 5B differs from the buffer circuit 520A in FIG. 5A at the feedback circuit. Specifically, a feedback circuit 550B in the buffer circuit 520B comprises a resistor divider having resistors R1, R2 electrically coupled in series between the output 542 of the driving circuit 540 and the ground. The feedback circuit 550B further comprises a connector 571 having a first end electrically coupled to a node 572 between the resistors R1, R2, and a second end electrically coupled to the second input 532 of the operational amplifier 535.

In operation, a voltage VA at the node 572 is applied as the feedback voltage $V_{FB}$ to the second input 532 of the operational amplifier 535. The feedback voltage $V_{FB}$ is determined as follows: $V_{FB}=V_A=V_{out}\times R2/(R1+R2)$. When the stable state is reached, $V_k=V_{FB}$ and, therefore, $V_{out}=V_k\times(R1+R2)/R2=V_k\times(1+R1/R2)$, i.e., $V_{out}>V_k$. As a result, it is possible to increase the analog voltage $V_{out}$ applied to the subsequent resistor array without increasing, or even while decreasing, the intermediate voltage $V_k$ output from the integrator circuit 510. In at least one embodiment, even when the sum of the currents in signal $Y_k$ (and, hence, the intermediate voltage $V_k$) is small, it is possible to apply a corresponding analog voltage $V_{out}$ of a sufficient voltage level to the subsequent resistor array, to ensure proper and/or reliable operation of the interface circuit and/or the IC including the interface circuit. In at least one embodiment, one or more advantages described herein with respect to one or more of the IC 200, the memory device 300, the interface circuit 400, or the interface circuit 500 are achievable by the buffer circuit 520B.

FIG. 5C is schematic circuit diagram of a buffer circuit 520C, in accordance with some embodiments. In some embodiments, the buffer circuit 520C is electrically coupled to the integrator circuit 510 to receive the intermediate voltage $V_k$ and configure an interface circuit corresponding to the interface circuit 500. Components in FIG. 5C having corresponding components in FIG. 5A are designated by the same reference numerals as in FIG. 5A.

The buffer circuit 520C in FIG. 5C differs from the buffer circuit 520A in FIG. 5A at the feedback circuit. Compared to the feedback circuit 550A in the buffer circuit 520A, a feedback circuit 550C in the buffer circuit 520C comprises, besides the connector 553 and transistor 555, an offset voltage circuit 573 electrically coupled to the connector 553. The offset voltage circuit 573 is configured to apply an offset voltage to the second input 532 of the operational amplifier 535.

For example, the analog voltage $V_{out}$ is applied from the output 542 to the offset voltage circuit 573, and is offset at the offset voltage circuit 573 by an offset voltage $V_{offset}$ before being applied to the second input 532 of the operational amplifier 535. The offset voltage circuit 573 is configured to cause the offset voltage $V_{offset}$ to be either added to $V_{out}$ or subtracted from $V_{out}$. In some embodiments, the offset voltage $V_{offset}$ is a positive voltage value and is subtracted from $V_{out}$, resulting in $V_{FB}=V_{out}-V_{offset}$. At the stable state, $V_k=V_{FB}$ and $V_{out}=V_k$ $V_{offset}$. As described herein, $V_k$ corresponds to $Y_k$, which in turn, corresponds to the sum of currents expressed by $\Sigma_{i=1}^{n}A_i\times W_{ij}$ in activation functions (2), (3). The additional component $V_{offset}$ corresponds to bias b in activation function (3). In other words, the feedback circuit 550C makes it possible, in one or more embodiments, to add an assigned bias b to a node to realize activation function (3). When the bias b to be added is positive, the offset voltage circuit 573 is configured to add a positive offset voltage $V_{offset}$ to analog voltage $V_{out}$, or to subtract a negative offset voltage $V_{offset}$ from the analog voltage $V_{out}$. An example circuit configuration of the offset voltage circuit 573 comprises a positive and/or negative power supply voltage supplied via an adjustable resistor to the connector 553. Controlling the adjustable resistor, e.g., by a controller as described herein, adjusts the voltage value and/or polarity of the offset voltage $V_{offset}$, resulting in an intended bias b. The described configuration of the offset voltage circuit 573 is an example. Other circuit configurations for applying offset voltages are within the scopes of various embodiments.

In at least one embodiment, an offset voltage circuit corresponding to the offset voltage circuit 573 is included in the connector 571 of the feedback circuit 550B in FIG. 5B. In such embodiment, $V_{out}=(V_k+V_{offset})\times(1+R1/R2)$. In at least one embodiment, one or more advantages described herein with respect to one or more of the IC 200, the memory device 300, the interface circuit 400, or the interface circuit 500 are achievable by the buffer circuit 520C.

FIG. 6 is a flowchart of a method 600 in accordance with some embodiments. In at least one embodiment, the method 600 is performed in or by one or more ICs, memory devices, interface circuits, or buffer circuits described with respect to FIGS. 2-4 and 5A-5C.

At operation 605, one or more first voltages are applied to corresponding one or more first input conductive lines. For example, as described with respect to FIG. 2, voltages or input signals $IN_1, IN_2, \ldots IN_r$ are applied to first input conductive lines 221, 222, ... 22r in a first resistor array 202. A first output conductive line 232 is electrically coupled to the first input conductive lines 221, 222, ... 22r through corresponding programmable resistors $G_{1,2}, G_{2,2}, G_{r,2}$ of the resistor array 202.

At operation 615, a second voltage is generated, wherein the second voltage corresponds to a sum of one or more currents caused by the one or more first voltages to flow through corresponding one or more programmable resistors to the first output conductive line. For example, as described with respect to FIG. 2, the input signal $IN_1$ causes a corresponding current $IN_1 \times G_{1,2}$ to flow from the input conductive line 221 through resistor $G_{1,2}$ to the output conductive line 232, the input signal $IN_2$ causes a corresponding current $IN_2 \times G_{2,2}$ to flow from the input conductive line 222 through resistor $G_{2,2}$ to the output conductive line 232, and the input signal $IN_r$ causes a corresponding current $IN_r \times G_{r,2}$ to flow from the input conductive line 22r through resistor $G_{r,2}$ to the output conductive line 232. The sum of the currents $IN_1 \times G_{1,2}+IN_2 \times G_{2,2}+ \ldots IN_r \times G_{r,2}$ that flow from the input conductive lines 221, 222, ... 22r to the output conductive line 232 is denoted as signal $Y_2$ on the output conductive line 232. A second voltage corresponding to the signal $Y_2$, or the sum of currents flowing on the output conductive line 232, is generated by an interface circuit 262. In some embodiments, the second voltage corresponds to the intermediate voltage $V_k$ described with respect to FIGS. 4 and 5A-5C.

At operation 625, an analog voltage corresponding to the second voltage is applied to a second input conductive line of a second resistor array. For example, as described with respect to FIGS. 4 and 5A-5C, an analog voltage $V_{out}$ corresponding to the second voltage $V_k$ is generated, and applied to an input conductive line of a subsequent resistor array. In the example configuration in FIG. 2, the analog voltage corresponds to analog voltage $IN'_2$ applied to a second input conductive line 242 of a second resistor array 204.

In at least one embodiment, the analog voltage (e.g., $V_{out}$) is generated from the second voltage (e.g., $V_k$) without performing an analog-to-digital conversion, as described herein.

In some embodiments, operations 605, 615, 625 correspond to a computation of an activate function at a node (e.g., $B_2$ in FIG. 1B) in a neural network. In at least one embodiment, all operations 605, 615, 625 are automatically performed by or under control of a controller, without user input or intervention. In at least one embodiment, one or more advantages described herein are achievable in the method 600.

The described methods and algorithms include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 7:
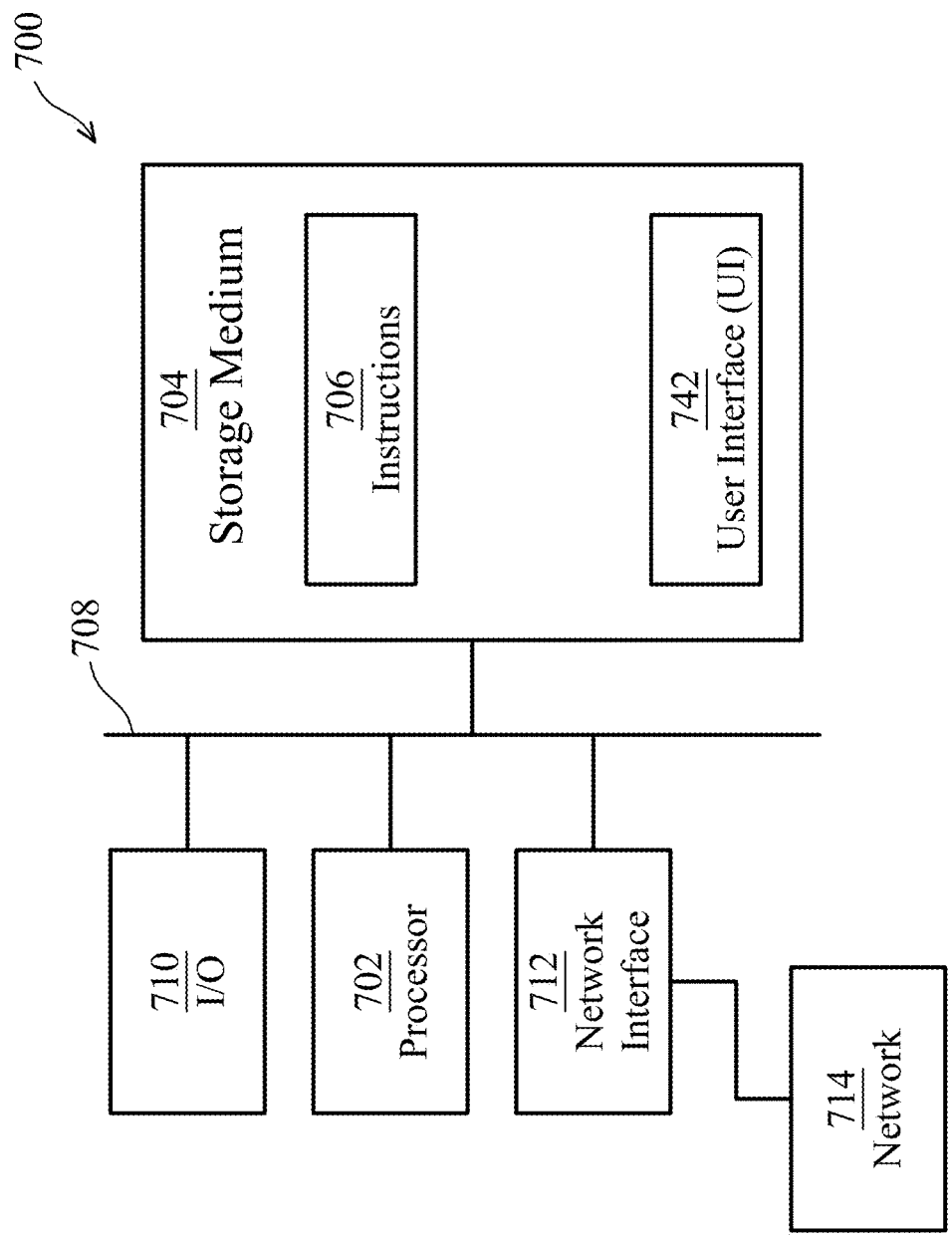
FIG. 7 is a block diagram of a computer system, in accordance with some embodiments.

FIG. 7 is a block diagram of a computer system 700 in accordance with some embodiments.

In some embodiments, system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 implements a portion or all of the methods or processes or operations described herein in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 to be usable for performing a portion or all of the noted processes and/or methods. In one or more embodiments, storage medium 704 also stores information which facilitates performing a portion or all of the noted processes and/or methods.

System 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

System 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. System 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application. In some embodiments, a portion or all of the noted processes and/or methods is implemented as a software application that is used by system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, an interface circuit comprises an integrator circuit and a buffer circuit. The integrator circuit is configured to be electrically coupled to a column of memory cells, receive a signal corresponding to a sum of currents flowing through the memory cells of the column, and integrate the signal over time to generate an intermediate voltage. The buffer circuit is electrically coupled to an output of the integrator circuit to receive the intermediate voltage, and is configured to be electrically coupled to a row of further memory cells, generate an analog voltage corresponding to the intermediate voltage, and output the analog voltage to the further memory cells of the row.

In some embodiments, an interface circuit comprises an integrator circuit, a comparator circuit, a driving circuit, and a feedback circuit. The integrator circuit is configured to receive a signal, and integrate the signal over time to generate an intermediate voltage. The comparator circuit has a first input electrically coupled to an output of the integrator circuit to receive the intermediate voltage. The driving circuit is electrically coupled to an output of the comparator circuit. The feedback circuit electrically couples an output of the driving circuit to a second input of the comparator circuit. The driving circuit is configured to generate an analog voltage under control of the comparator circuit. The feedback circuit is configured to apply a feedback voltage corresponding to the analog voltage to the second input of the comparator circuit. The comparator circuit is configured to perform a comparison between the intermediate voltage and the feedback voltage, and control the driving circuit to generate the analog voltage in accordance with a result of the comparison.

In some embodiments, a method comprises applying one or more first voltages to corresponding one or more first input conductive lines. A first output conductive line is electrically coupled to the one or more first input conductive lines through corresponding one or more programmable resistors of a first resistor array. The method further comprises generating a second voltage which corresponds to a sum of one or more currents caused by the one or more first voltages to flow through the corresponding one or more programmable resistors to the first output conductive line. The method further comprises applying an analog voltage corresponding to the second voltage to a second input conductive line of a second resistor array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interface circuit, comprising:
    an integrator circuit configured to
        be electrically coupled to a column of memory cells,
        receive a signal corresponding to a sum of currents flowing through the memory cells of the column, and
        integrate the signal over time to generate an intermediate voltage; and
    a buffer circuit electrically coupled to an output of the integrator circuit to receive the intermediate voltage, and configured to
        be electrically coupled to a row of further memory cells,
        generate an analog voltage corresponding to the intermediate voltage, and
        output the analog voltage to the further memory cells of the row.

2. The interface circuit of claim 1, wherein the buffer circuit comprises:
    a comparator circuit having a first input electrically coupled to the output of the integrator circuit to receive the intermediate voltage,
    a driving circuit electrically coupled to an output of the comparator circuit, and
    a feedback circuit electrically coupling an output of the driving circuit to a second input of the comparator circuit.

3. The interface circuit of claim 2, wherein
the driving circuit is configured to generate the analog voltage under control of the comparator circuit,
the feedback circuit is configured to apply a feedback voltage corresponding to the analog voltage to the second input of the comparator circuit, and
the comparator circuit is configured to
perform a comparison between the intermediate voltage and the feedback voltage, and
control the driving circuit to generate the analog voltage in accordance with a result of the comparison.

4. The interface circuit of claim 1, wherein
the integrator circuit comprises an operational amplifier and a capacitor,
the operational amplifier includes:
a first input configured to receive the signal, and
an output configuring the output of the integrator circuit, and
the capacitor is electrically coupled between the first input and the output of the operational amplifier.

5. The interface circuit of claim 1, wherein the buffer circuit comprises:
an operational amplifier including:
a first input electrically coupled to the output of the integrator circuit,
a second input, and
an output, and
a first transistor including:
a gate terminal electrically coupled to the output of the operational amplifier,
a first source/drain terminal at which the analog voltage is to be generated, and
a second source/drain terminal electrically coupled to a first node of a first power supply voltage.

6. The interface circuit of claim 5, wherein the buffer circuit further comprises:
a connector including:
a first end electrically coupled to the first source/drain terminal of the first transistor, and
a second end electrically coupled to the second input of the operational amplifier.

7. The interface circuit of claim 6, wherein the buffer circuit further comprises:
a second transistor including:
a controllable gate terminal,
a first source/drain terminal electrically coupled to the first source/drain terminal of the first transistor and the first end of the connector, and
a second source/drain terminal electrically coupled to a second node of a second power supply voltage different from the first power supply voltage.

8. The interface circuit of claim 5, wherein the buffer circuit further comprises:
a first resistor and a second resistor electrically coupled in series between
the first source/drain terminal of the first transistor, and
a second node of a second power supply voltage different from the first power supply voltage, and
a connector including:
a first end electrically coupled to an intermediate node between the first resistor and the second resistor, and
a second end electrically coupled to the second input of the operational amplifier.

9. The interface circuit of claim 5, wherein the buffer circuit further comprises:
a connector including:
a first end electrically coupled to the first source/drain terminal of the first transistor, and
a second end electrically coupled to the second input of the operational amplifier, and
an offset voltage circuit electrically coupled to the connector, and configured to apply an offset voltage to the second input of the operational amplifier.

10. An interface circuit, comprising:
an integrator circuit configured to receive a signal, and integrate the signal over time to generate an intermediate voltage;
a comparator circuit having a first input electrically coupled to an output of the integrator circuit to receive the intermediate voltage;
a driving circuit electrically coupled to an output of the comparator circuit; and
a feedback circuit electrically coupling an output of the driving circuit to a second input of the comparator circuit,
wherein
the driving circuit is configured to generate an analog voltage under control of the comparator circuit,
the feedback circuit is configured to apply a feedback voltage corresponding to the analog voltage to the second input of the comparator circuit, and
the comparator circuit is configured to
perform a comparison between the intermediate voltage and the feedback voltage, and
control the driving circuit to generate the analog voltage in accordance with a result of the comparison.

11. The interface circuit of claim 10, further comprising:
a switch electrically coupled between the output of the driving circuit and an output of the interface circuit.

12. The interface circuit of claim 10, wherein
the integrator circuit comprises an operational amplifier and a capacitor,
the operational amplifier has
a first input configured to receive the signal,
a second input which is grounded, and
an output configuring the output of the integrator circuit, and
the capacitor is electrically coupled between the first input and the output of the operational amplifier.

13. The interface circuit of claim 10, wherein
the comparator circuit comprises an operational amplifier having the first input, the second input and the output of the comparator circuit, and
the driving circuit comprises a transistor having
a gate terminal electrically coupled to the output of the operational amplifier,
a first source/drain terminal configuring the output of the driving circuit, and
a second source/drain terminal electrically coupled to a node of a power supply voltage.

14. The interface circuit of claim 10, wherein the feedback circuit comprises:
a connector having
a first end electrically coupled to the output of the driving circuit, and
a second end electrically coupled to the second input of the comparator circuit, and a transistor having
- a controllable gate terminal,
- a first source/drain terminal electrically coupled to the output of the driving circuit and the first end of the connector, and
- a second source/drain terminal which is grounded.

15. The interface circuit of claim 10, wherein the feedback circuit comprises:
- a resistor divider having a first resistor and a second resistor electrically coupled in series between the output of the driving circuit and the ground, and
- a connector having
  - a first end electrically coupled to a node between the first resistor and the second resistor of the resistor divider, and
  - a second end electrically coupled to the second input of the comparator circuit.

16. The interface circuit of claim 10, wherein the feedback circuit comprises:
- a connector having
  - a first end electrically coupled to the output of the driving circuit, and
  - a second end electrically coupled to the second input of the comparator circuit, and
- an offset voltage circuit electrically coupled to the connector, and configured to apply an offset voltage to the second input of the comparator circuit.

17. A method, comprising:
- applying one or more first voltages to corresponding one or more first input conductive lines, wherein a first output conductive line is electrically coupled to the one or more first input conductive lines through corresponding one or more programmable resistors of a first resistor array;
- generating a second voltage which corresponds to a sum of one or more currents caused by the one or more first voltages to flow through the corresponding one or more programmable resistors to the first output conductive line; and
- applying an analog voltage corresponding to the second voltage to a second input conductive line of a second resistor array.

18. The method of claim 17, further comprising:
- generating the analog voltage from the second voltage, without performing an analog-to-digital conversion.

19. The method of claim 17, wherein
the analog voltage is equal to
- the second voltage, or
- the second voltage multiplied by a ratio other than 1.

20. The method of claim 17, wherein
the analog voltage is equal to
- the second voltage offset by an offset voltage, or
- the second voltage offset by the offset voltage, and then multiplied by a ratio other than 1.

* * * * *